(12) United States Patent
Silvanto et al.

(10) Patent No.: US 10,642,327 B1
(45) Date of Patent: May 5, 2020

(54) ELECTRONIC DEVICES WITH COOLING SYSTEMS

(71) Applicant: Apple Inc., Cupertino, CA (US)

(72) Inventors: Mikael M. Silvanto, San Francisco, CA (US); Richard D. Kosoglow, San Jose, CA (US); David H. Narajowski, Los Gatos, CA (US); Bart K. Andre, Palo Alto, CA (US); Brett W. Degner, Menlo Park, CA (US); Daniele G. De Iuliis, San Francisco, CA (US); Houtan R. Farahani, San Ramon, CA (US); Eric R. Prather, Portola Valley, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/049,682

(22) Filed: Jul. 30, 2018

Related U.S. Application Data

(60) Provisional application No. 62/545,395, filed on Aug. 14, 2017.

(51) Int. Cl.
  *H05K 7/20* (2006.01)
  *G06F 1/20* (2006.01)
  *H05K 9/00* (2006.01)

(52) U.S. Cl.
  CPC .......... *G06F 1/206* (2013.01); *H05K 7/20145* (2013.01); *H05K 7/20209* (2013.01); *H05K 7/20972* (2013.01); *H05K 9/0054* (2013.01)

(58) Field of Classification Search
  CPC ..................... H05K 7/20972; H05K 9/0054
  See application file for complete search history.

(56) References Cited

U.S. PATENT DOCUMENTS

| | | | |
|---|---|---|---|
| 6,209,973 B1 | 4/2001 | Steinberg | |
| 7,857,276 B2 | 12/2010 | Chen | |
| 8,587,939 B2 * | 11/2013 | McClure | G06F 1/1626 361/679.3 |
| 9,019,700 B2 * | 4/2015 | Ballantine | H05K 7/20763 174/377 |
| 9,148,979 B2 | 9/2015 | Chiriac et al. | |
| 9,232,171 B2 * | 1/2016 | Sugiura | H04N 5/64 |
| 9,338,923 B2 * | 5/2016 | Lee | G03B 21/16 |
| 9,348,376 B2 * | 5/2016 | Kamepalli | G06F 1/1632 |
| 9,795,068 B2 * | 10/2017 | Zhang | H05K 9/0054 |

(Continued)

*Primary Examiner* — Robert J Hoffberg
(74) *Attorney, Agent, or Firm* — Treyz Law Group, P.C.; G. Victor Treyz; Matthew R. Williams

(57) ABSTRACT

An electronic device may be provided with a housing surrounding an interior portion of the electronic device. The housing may have one or more layers of material such as fabric layers, polymer layers, and metal layers. An outer fabric layer may have openings between adjacent strands of material such as openings between adjacent warp and weft strands. An inner housing layer such as a layer of plastic or metal may have openings that define airflow entrance and exit ports. The outer fabric layer may overlap the openings of the airflow entrance and exit ports. A fan may draw cooling air into the interior through the airflow entrance port and may expel air through the airflow exit port. An airflow controller in the interior may be controlled by control circuitry based on measurements from temperature sensors. The airflow controller may steer airflow to cool appropriate electronic components in the interior.

27 Claims, 15 Drawing Sheets

(56) References Cited

U.S. PATENT DOCUMENTS

| | | | |
|---|---|---|---|
| 2006/0227503 A1 | 10/2006 | Ho et al. | |
| 2011/0149495 A1 | 6/2011 | Mongia et al. | |
| 2011/0242746 A1* | 10/2011 | Hoffman | G06F 1/1613 |
| | | | 361/679.02 |
| 2012/0160136 A1 | 6/2012 | Lineal et al. | |
| 2014/0293522 A1* | 10/2014 | Zhang | H05K 9/0054 |
| | | | 361/679.01 |

* cited by examiner

ELECTRONIC DEVICES WITH COOLING SYSTEMS

This application claims the benefit of provisional patent application No. 62/545,395, filed Aug. 14, 2017, which is hereby incorporated by reference herein in its entirety.

FIELD

This relates generally to electronic devices, and, more particularly, to electronic devices with cooling.

BACKGROUND

Electronic devices may contain processing circuitry, displays, and other components that generate heat. Some devices contain cooling systems to help remove excess heat. For example, a cooling system with a fan may be used to create airflow that cools hot components.

The use of a cooling system to remove heat from an electronic device can pose challenges. If care is not taken, cooling vents and other structures that are used to accommodate a cooling system may be unsightly or may exhibit unsatisfactory cooling performance.

SUMMARY

An electronic device such as a computer or other device may have an interior. Electronic components in the interior may generate heat. A fan may create cooling airflow through the device to cool the electrical components.

The electronic device may have a housing. A display and other components may be mounted in the housing. The housing may have one or more layers of material such as fabric layers, polymer layers, and metal layers. An outer layer of fabric may have openings between adjacent strands of material such as openings between adjacent warp and weft strands. An inner housing layer such as a layer of plastic or metal may have perforations, slots, or other openings that define airflow entrance and exit ports. The outer fabric layer may overlap the openings of the airflow entrance and exit ports.

During operation, a fan may draw cooling air into the interior through the airflow entrance port and may expel air through the airflow exit port. An airflow controller in the interior may be controlled by control circuitry. For example, an airflow controller may be controlled by control circuitry based on temperature information that the control circuitry gathers from temperature sensor circuitry. The airflow controller may be used to steer airflow within the housing of the electronic device to cool selected electronic components in the interior.

DETAILED DESCRIPTION

Electronic devices may contain components such as integrated circuits, displays, power supplies, and other circuits that generate heat. To remove the heat from an electronic device, the electronic device may be provided with a cooling system. The cooling system may include one or more fans that create airflow that helps remove excess heat from the electronic device.

Figure 1:
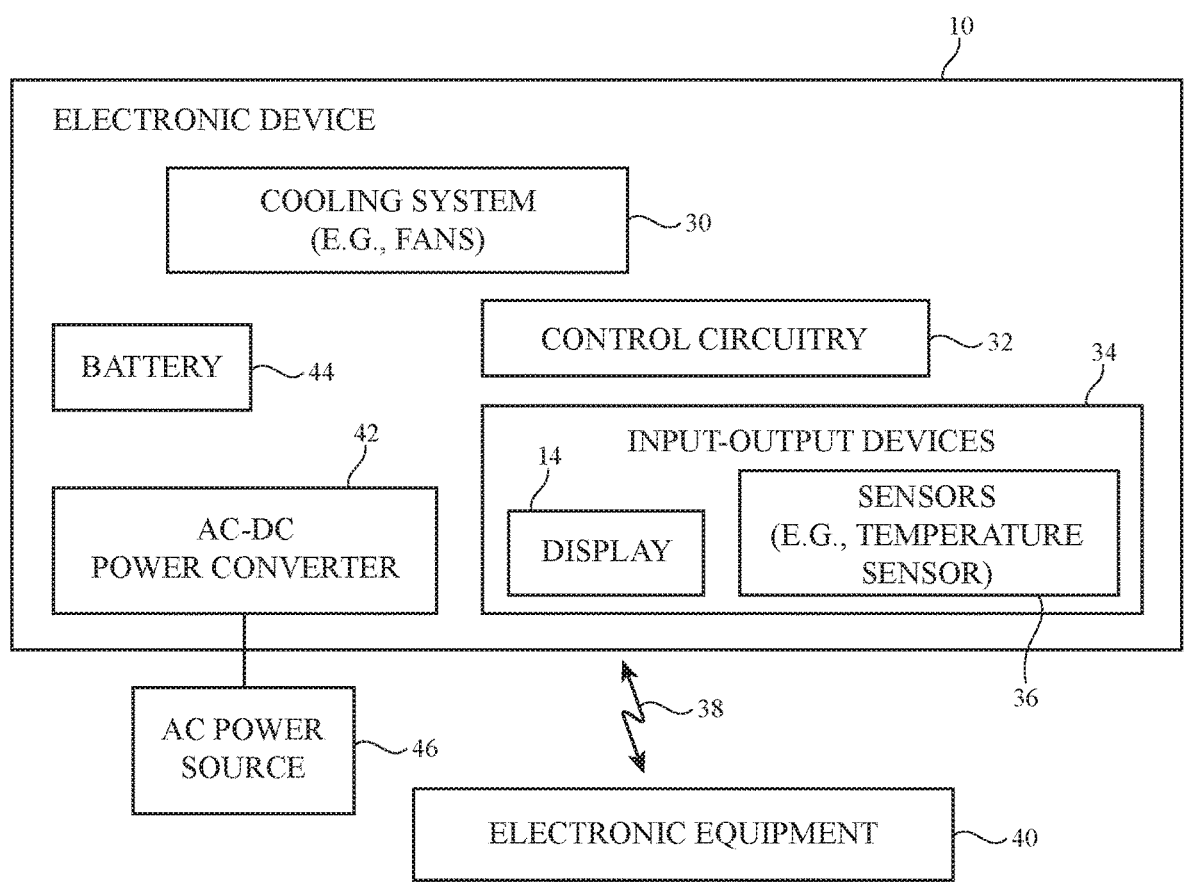
FIG. 1 is a schematic diagram of an illustrative device with a cooling system in accordance with an embodiment.

An illustrative electronic device of the type that may be provided with a cooling system is shown in FIG. 1. As shown in FIG. 1, electronic device 10 may have control circuitry 32. Control circuitry 32 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 32 may be used to control the operation of device 10. The processing circuitry may be based on one or more integrated circuits such as microprocessors, microcontrollers, digital signal processors, baseband processors, power management units, audio chips, application specific integrated circuits, etc.

Input-output circuitry in device 10 such as input-output devices 34 may be used to allow data to be supplied to device 10 and to allow data to be provided from device 10 to external devices. Input-output devices 34 may include buttons, joysticks, scrolling wheels, touch pads, key pads, keyboards, microphones, speakers, tone generators, vibrators, cameras, light-emitting diodes and other status indicators, data ports, etc. Input-output devices 34 may also include sensors 36. Sensors 36 may include touch sensors, force sensors, temperature sensors, gas pressure sensors, ambient light sensors, humidity sensors, capacitive proximity sensors, light-based proximity sensors, and/or other sensors. A user can control the operation of device 10 by supplying commands through input-output devices 34 and may receive status information and other output from device 10 using the output resources of input-output devices 34. Input-output devices 34 may also be used to make environmental measurements such as light and temperature measurements. For example, input-output devices may make external temperature measurements on the temperature of the environment in which device 10 is operating, internal temperature measurements such as internal air temperature measurements, and/or internal component temperature measurements.

Input-output devices 34 may include one or more displays such as display 14. Display 14 may be a liquid crystal display, an organic light-emitting diode display, an electrophoretic display, or any other suitable type of display. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements.

Device 10 may receive power from an internal power source such as battery 44 and/or from an external power source such as power source 46. Power source 46 may be an alternating-current (AC) power source such as a mains power supply. Alternating-current power from power source 46 may be converted to direct-current (DC) power by power converter circuitry such as alternating-current-to-direct-current power converter 42. Power converter 42 may supply direct-current power to battery 44 to charge battery 44 and may supply power to a display and other circuitry in device 10.

Cooling system 30 may include heat sinks, water circulation systems, heat pipes, electronic cooling components such as Peltier effect devices, fans for creating airflow into and out of device 10, airflow adjustment devices (e.g., adjustable airflow controllers that steer airflow in desired directions and/or which reduce or increase airflow resistance through cooling system 30), and/or may include other cooling system components.

Control circuitry 32 may be used to run software on device 10 such as operating system code and applications. During operation of device 10, control circuitry 32 may receive input from devices 34 and may provide output using devices 34. For example, software running on control circuitry 32 may display images on display 14. Control circuitry 32 may also control cooling system 30 (e.g., a airflow controller configured to steer airflow separately from one or more fans in system 30, etc.).

Control circuitry 32 may include communications circuitry for supporting wired and/or wireless communications with external equipment 40 over communication links such as link 38. Link 38 may be a wireless link such as a Bluetooth® link, a WiFi® link, or other wireless local area network link and/or may be a cellular telephone link or other longer-range wireless link. Power and/or data may be conveyed wirelessly to and/or from device 10. Equipment 40 may be a peer device (e.g., a device such as device 10), an accessory (e.g., headphones, a keyboard, a mouse, trackpad or other pointing device, speakers, etc.) and/or may be equipment that is controlled by device 10 (e.g., audio-visual equipment, etc.).

Figure 2:
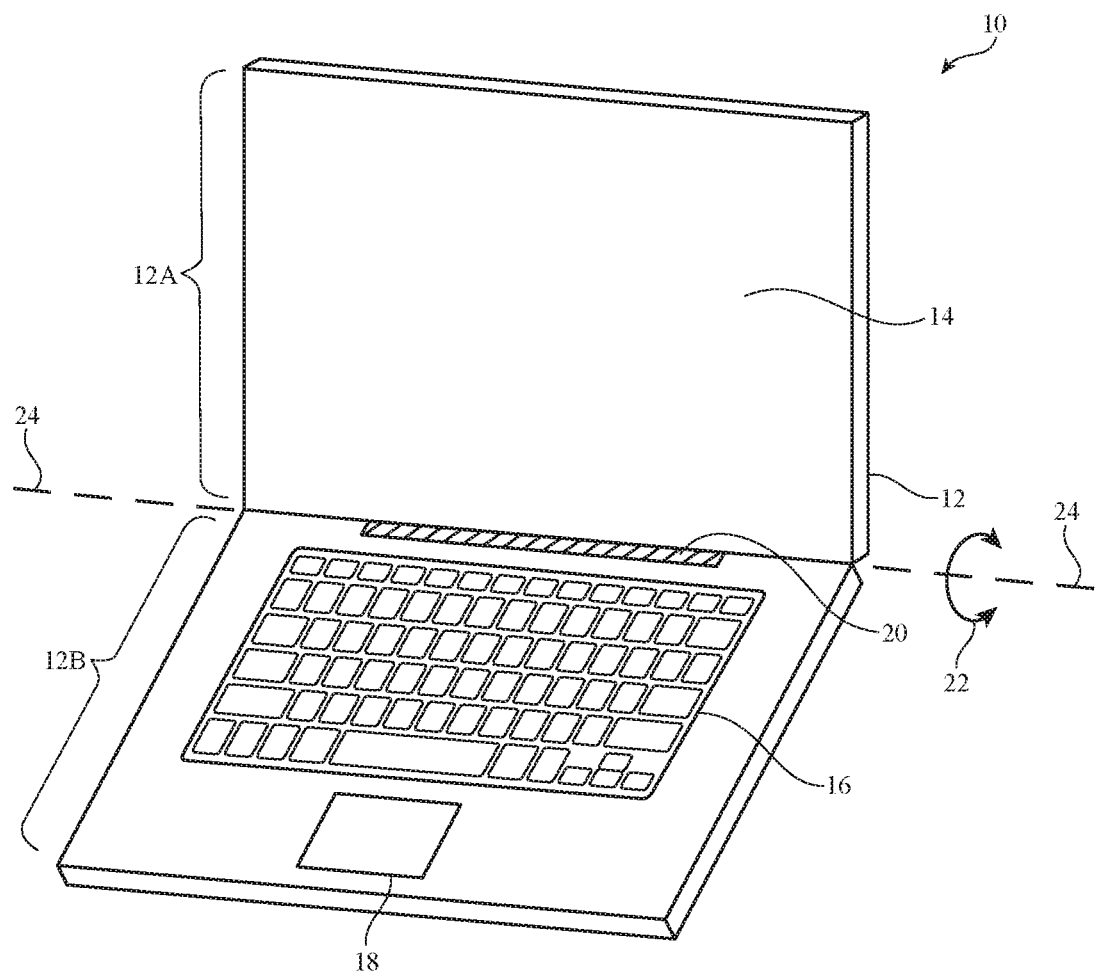
FIG. 2 is a perspective view of an illustrative electronic device such as a laptop computer in accordance with an embodiment.

FIG. 2 shows how electronic device 10 may have the shape of a laptop computer having upper housing 12A and lower housing 12B with components such as keyboard 16 and touchpad 18. Device 10 may have hinge structures 20 that allow upper housing 12A to rotate in directions 22 about rotational axis 24 relative to lower housing 12B. Display 14 may be mounted in upper housing 12A. Upper housing 12A, which may sometimes referred to as a display housing or lid, may be placed in a closed position by rotating upper housing 12A towards lower housing 12B about rotational axis 24.

Figure 3:
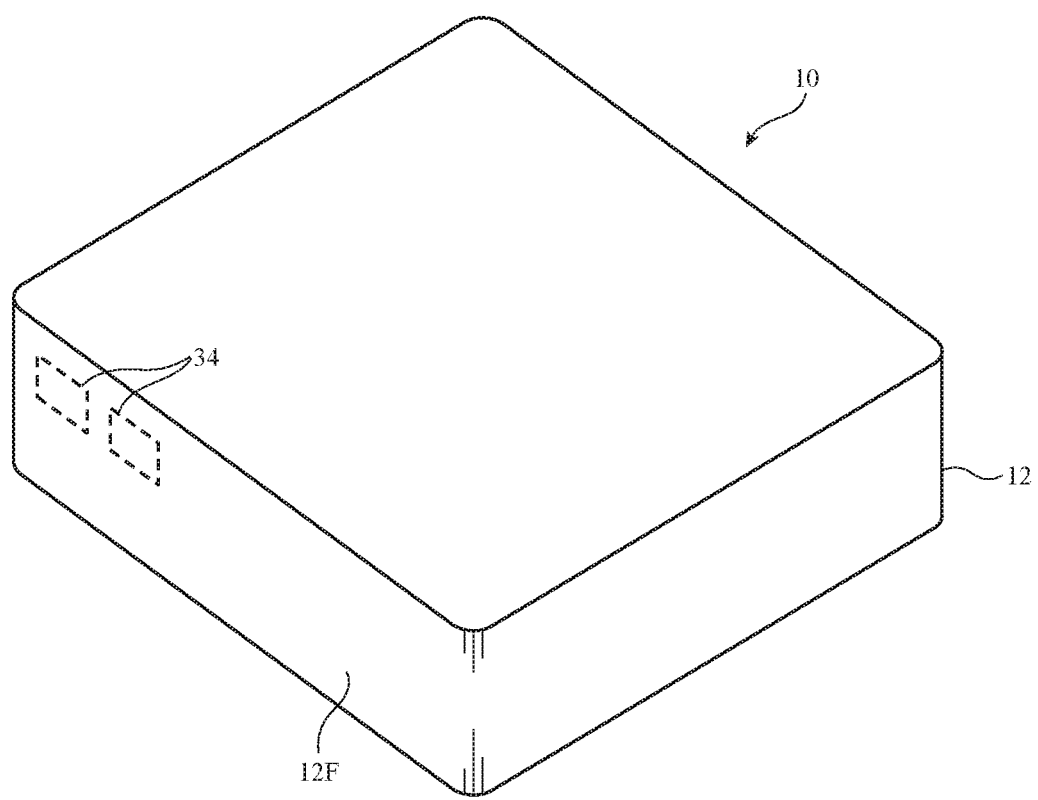
FIG. 3 is a perspective view of an illustrative electronic device in accordance with an embodiment.

FIG. 3 shows how electronic device 10 may be a set-top box, desktop device, gaming unit, countertop digital assistant (e.g., a voice-controlled device), or other device. In this type of configuration for device 10, housing 12 may be a box-shaped housing with faces such as illustrative front face 12F on which input-output devices 34 may be located.

Figure 4:
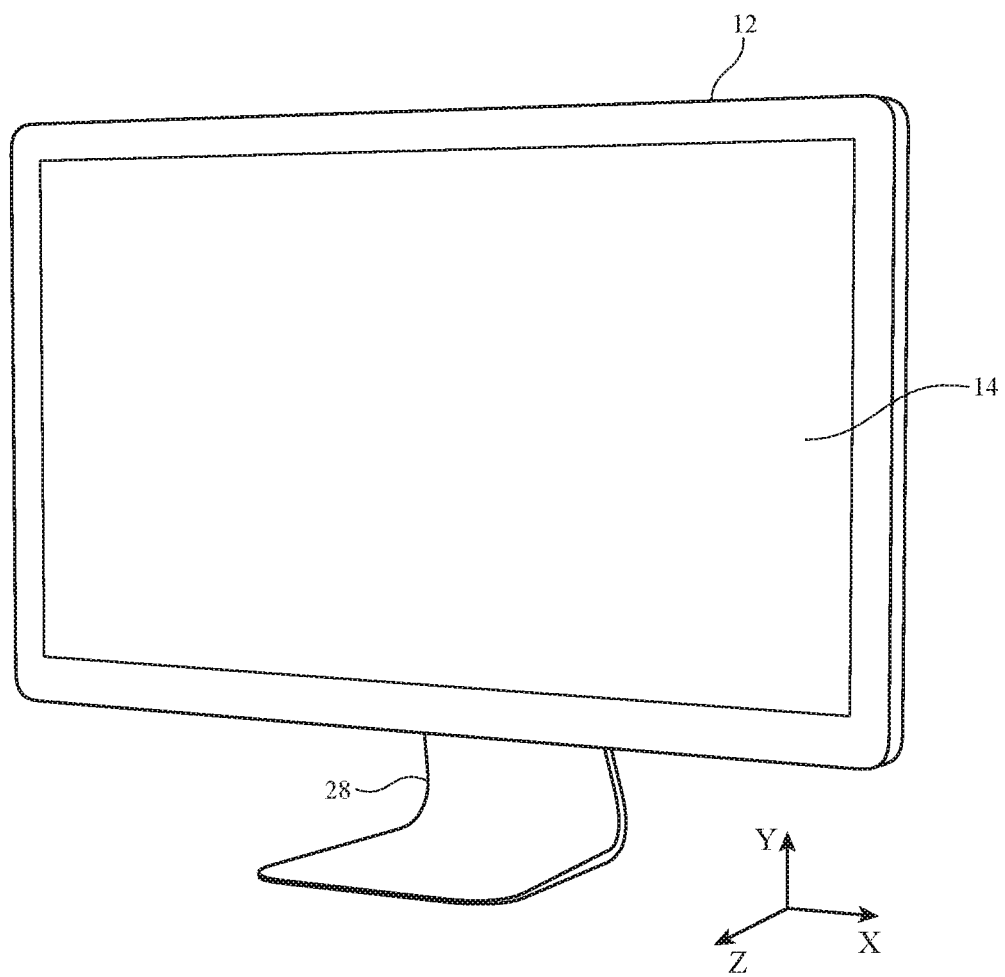
FIG. 4 is a perspective view of an illustrative electronic device with a cooling system and a display in accordance with an embodiment.

FIG. 4 shows how electronic device 10 may be a computer display or a computer that has been integrated into a computer display. With this type of arrangement, housing 12 for device 10 may be mounted on a support structure such as stand 28 or stand 28 may be omitted (e.g., to mount device 10 on a wall). Display 14 may be mounted on a front face of housing 12. Stand 28 may be connected to the center of housing 12 on an opposing rear face of device 10 (e.g., by a fixed attachment structure, a hinge, etc.).

The illustrative configurations for device 10 that are shown in FIGS. 2, 3, and 4 are merely illustrative. In general, electronic device 10 may be a laptop computer, a tablet computer, a cellular telephone, a wristwatch device, a television, a computer monitor containing an embedded computer, a computer display that does not contain an embedded computer, a gaming device, a set-top box, a voice-controlled digital assistant with a speaker, a navigation device, an embedded system such as a system in which electronic equipment with a display is mounted in a kiosk or automobile, equipment that implements the functionality of two or more of these devices, or other electronic equipment.

Housing 12 of device 10, which may sometimes be referred to as a case or enclosure, may be formed of materials such as polymer, glass, ceramics, fabric, metal (e.g., machined aluminum, stainless steel, or other metals), other materials, or a combination of these materials. One or more layers of material may be used in forming housing 12. For example, an outer layer may be formed from fabric or other material and an inner layer may be formed from polymer or metal or other material (as examples). Housing 12 or an inner housing layer that is covered by fabric may be formed using a unibody construction in which most or all of the housing or an inner housing portion is formed from a single structural element (e.g., a piece of machined metal or a piece of molded plastic) or may be formed from multiple housing structures (e.g., outer housing structures that have been mounted to internal frame elements or other internal housing structures).

The components of device 10 may generate heat during operation. For example, power converter 42 and power system circuitry associated with battery 44 may generate heat. Heat may be generated by integrated circuits associated with a graphics processing unit, microprocessor, and/or other storage and processing circuitry in control circuitry 32. Display 14 and other input-output devices 34 may also generate heat. To prevent excess heat build-up in the interior of housing 12, cooling system 30 may be used to cool device 10 by causing cool ambient air to flow over hot components (e.g., integrated circuits, heat sink structures on integrated circuits and/or other heat-producing circuitry, etc.).

Figure 5:
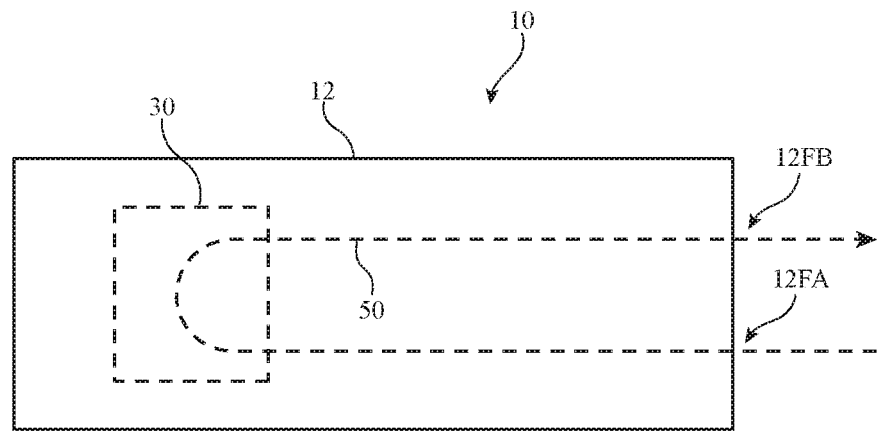
FIG. 5 is a cross-sectional side view of an illustrative electronic device with a cooling system in accordance with an embodiment.

FIG. 5 is a cross-sectional side view of a device such as device 10 of FIG. 3. As shown by illustrative airflow path 50 in FIG. 5, cooling system 30 may be used to draw cool ambient air into device 10 through portion 12FA of housing 12 (e.g., an airflow entrance port). After being heated by internal components in the interior of housing 12, corresponding heated air may be expelled through portion 12FB (e.g., an airflow exit port) by cooling system 30. In general, air entrance ports and exit ports may be formed in any suitable portions of housing 12 that are exposed to the environment surrounding device 10 (e.g., in housing walls on front, rear, side faces, and/or other faces of device 10, on cylindrical sidewall housing surfaces, on planar housing wall surfaces, etc.).

Figure 6:
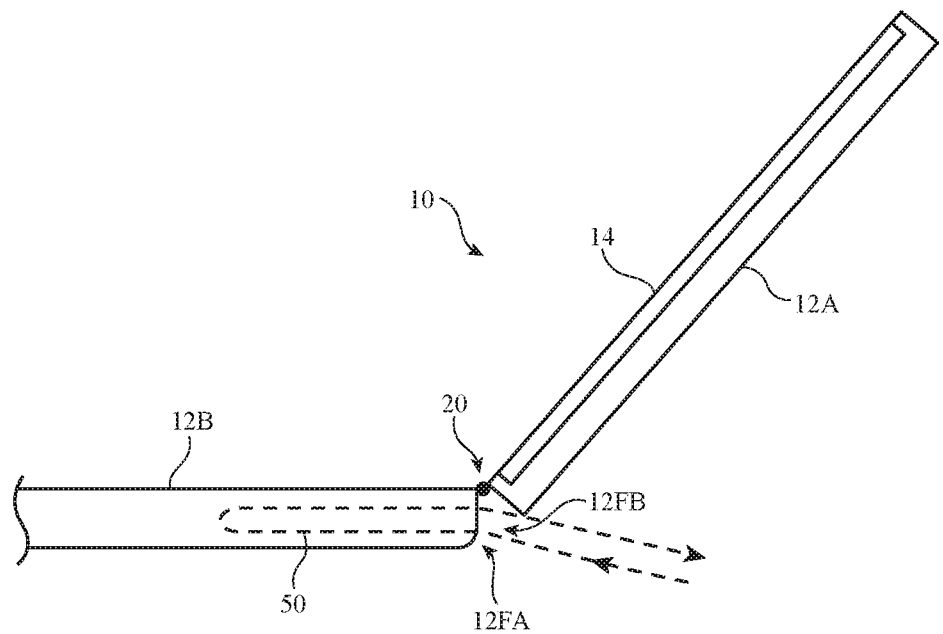
FIG. 6 is a cross-sectional side view of an illustrative electronic device such as a laptop computer in accordance with an embodiment.

In the example of FIG. 6, device 10 is a laptop computer of the type shown in FIG. 2. Airflow entrance port 12FA and airflow exit port 12FB are formed in portions of the rear housing wall of lower housing 12B, adjacent to hinge structures 20.

Figure 7:
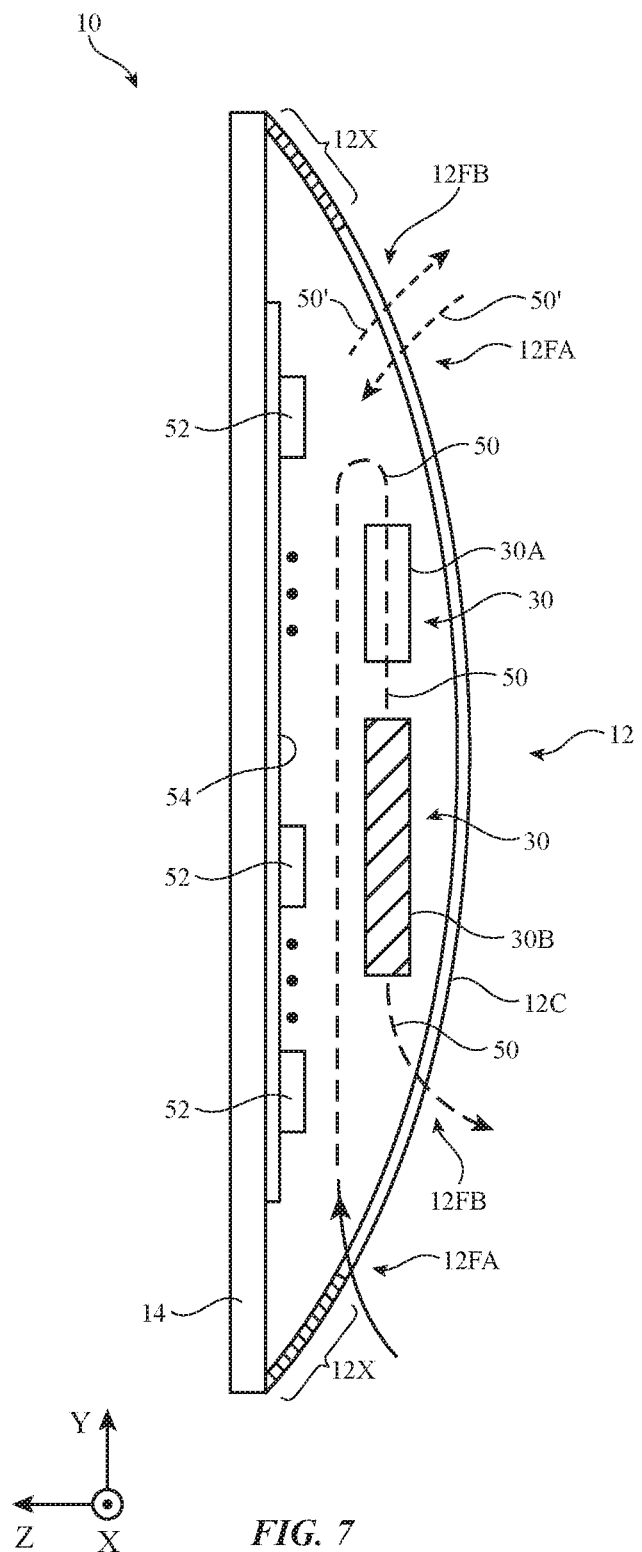
FIG. 7 is a cross-sectional side view of an illustrative electronic device such as a computer or other device with a display and a cooling system in accordance with an embodiment.

FIG. 7 is a cross-sectional side view of an electronic device such as device 10 of FIG. 4. As shown in FIG. 4, display 14 may be mounted in housing 12 on the front face of device 10. Stand 28 (FIG. 4) may be coupled to housing 12 on an opposing rear face of device 10. Internal components 52 (e.g., the circuitry of device 10 shown in FIG. 1) may be mounted on substrates such as substrate 54. Substrate 54 may be a printed circuit such as a rigid printed circuit board or a flexible printed circuit formed from a sheet of polyimide or other flexible polymer substrate layer. Portion 12X of housing 12 may be formed from metal or may be formed form other suitable materials (polymer, fabric, etc.). Portion 12X may form a rectangular ring-shaped member that extends around the periphery of device 10 when viewed from the rear of device 10. Remaining portions of housing 12 (e.g., central portion 12C) may be formed from one or more layers and may have one or more regions that allow air to pass. As an example, portion 12C of housing 12 may be formed from fabric, metal and/or plastic with perforations and/or other openings, and/or other suitable materials.

The materials that make up housing 12 may be configured to form ports that allow air to pass into and out of device 10, as shown by illustrative airflow path 50. As an example, housing 12 may having airflow openings that are configured to form airflow entrance port(s) 12FA (e.g., air cooling entrance ports) and/or airflow exit port(s) 12FB (e.g., air cooling exit ports). Air cooling ports may be formed in upper and lower portions of housing 12 of FIG. 7 and/or in other suitable portions of housing 12. Cooling system 30 may be used to force ambient air to flow along cooling path 50, along optional cooling paths 50', and/or other suitable airflow paths. Cooling system 30 may include components such as fan(s) 30A (sometimes referred to as blowers) and heat-sink fins 30B or other heatsink structures. Heat-sink structures such as fins 30B and/or other heat-dissipating structures in device 10 may have portions that are mounted to components 52 (e.g., using thermal compound, using heat pipes, etc.) and may be overlapped by fabric or other materials in housing 12 (e.g., fabric with openings forming an airflow port and/or other fabric, metal mesh with airflow port openings, etc.).

Figure 8:
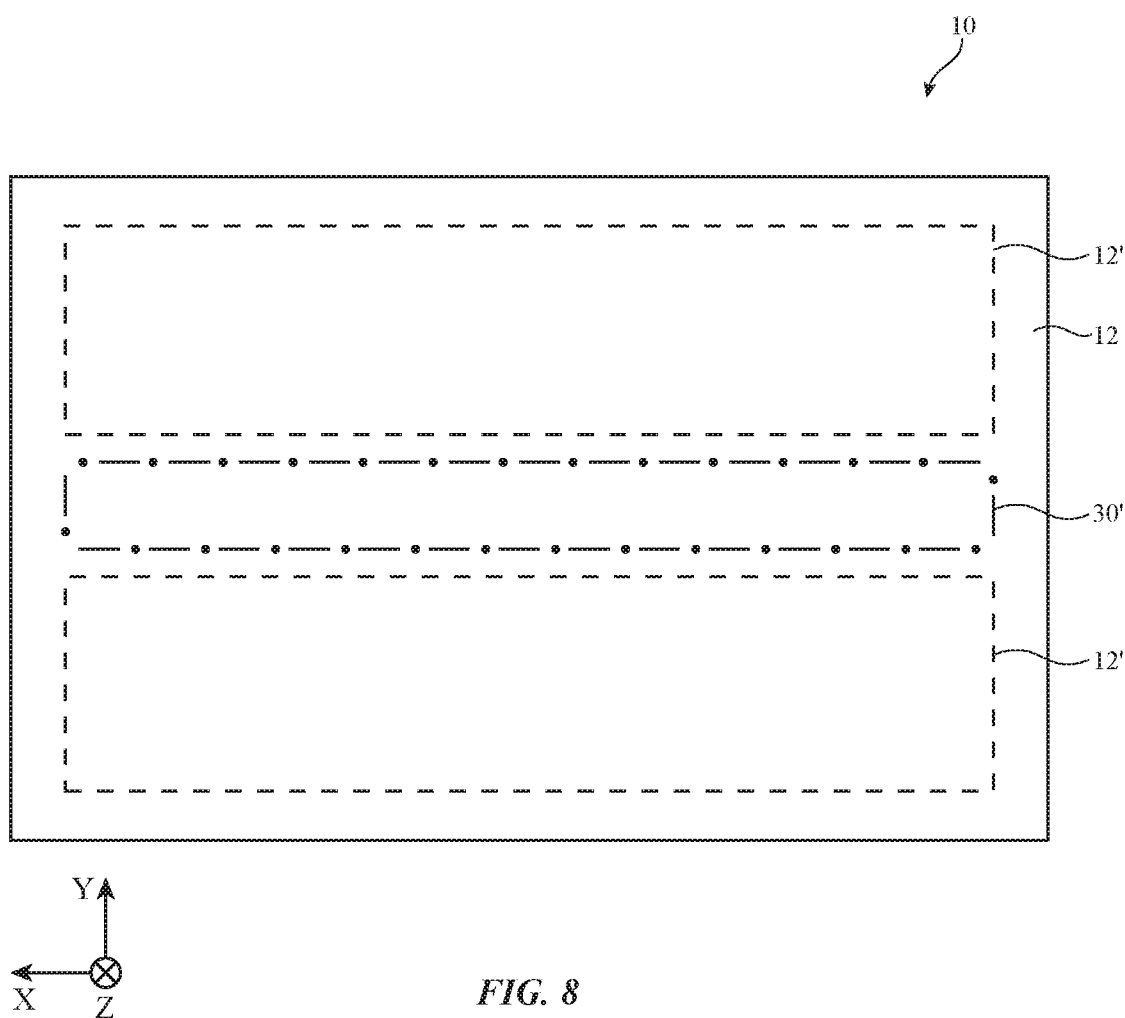
FIG. 8 is a rear view of the illustrative electronic device of FIG. 7 in accordance with an embodiment.

FIG. 8 is a rear view of housing 12 of FIG. 7 showing illustrative airflow port locations 12' and an illustrative cooling system location 30'. The components of cooling system 30 may overlap some or all of location 30'. Airflow entrance and exit ports may overlap some or all of regions 12'. Configurations in which airflow entrance and/or exit ports overlap some of area 30 and/or in which cooling system 30 has components that overlap some of area 12' may also be used.

In some configurations, portions of housing 12 including portions of housing 12 that overlap airflow entrance and exit ports may be formed from materials that exhibit low resistance to airflow. These materials may include, for example, open cell foam, wired or plastic mesh (e.g., wire mesh or other metal mesh, mesh formed from polymer, mesh formed from metal and polymer, woven fabric or other fabric, and/or layers with perforations and/or other openings such as perforated structures formed form metal, polymer, glass, etc.).

With one illustrative configuration, one or more portions of housing 12 (e.g., an outer housing wall layer, etc.) may be formed form fabric. The fabric may be sufficiently porous to allow air to flow into and out of the interior of housing 12. At the same time, the fabric may have an attractive appearance and may cover potentially unsightly interior structures from view (e.g., potentially unsightly openings in metal and/or polymer housing layers may be hidden from view in the airflow entrance and exit ports of device 10 by overlapping one or more fabric layers with the airflow entrance and exit ports). Fabric may be black, may be white, may be gray, may have non-neutral colors (red, green, blue, etc.) and/or may have other suitable patterned and/or solid colors.

Figure 9:
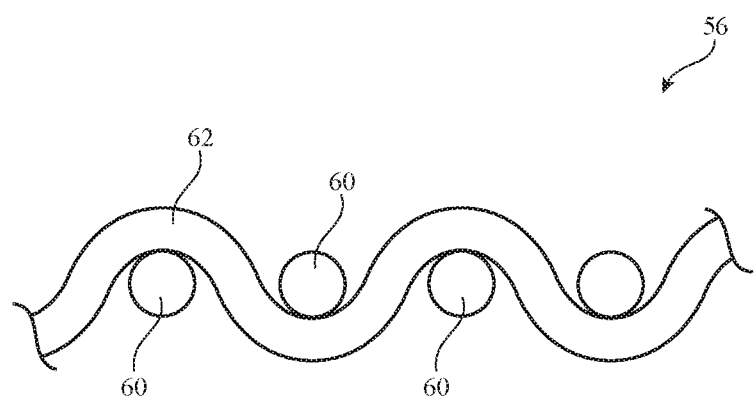
FIG. 9 is a cross-sectional side view of an illustrative fabric layer in accordance with an embodiment.

A cross-sectional side view of illustrative fabric 56 for forming housing 12 is shown in FIG. 9. Fabric 56 may be formed from yarns and/or monofilaments that are intertwined using any suitable intertwining equipment (e.g., knitting equipment for forming knit fabric, braiding equipment for forming braided fabric, etc.). For example, fabric 56 may be woven fabric formed using a weaving machine. Woven fabric may have a plain weave, a basket weave, a satin weave, a twill weave, or variations of these weaves, may be a three-dimensional woven fabric, or may be other suitable fabric. As shown in FIG. 9, fabric 56 may be formed from strands of material such as warp strands 60 and weft strands 62. Strands 60 and 62 may be formed form monofilaments and/or multifilament yarns of polymer, metal, polymer coated with metal and/or optional additional layers (e.g., a polymer outer insulating layer), may be natural materials such as cotton, and/or may be other suitable strands of material. In the illustrative configuration of FIG. 9, fabric 56 has a single layer of woven yarns. Multi-layer fabric constructions may be used for fabric 56 if desired.

Figure 10:
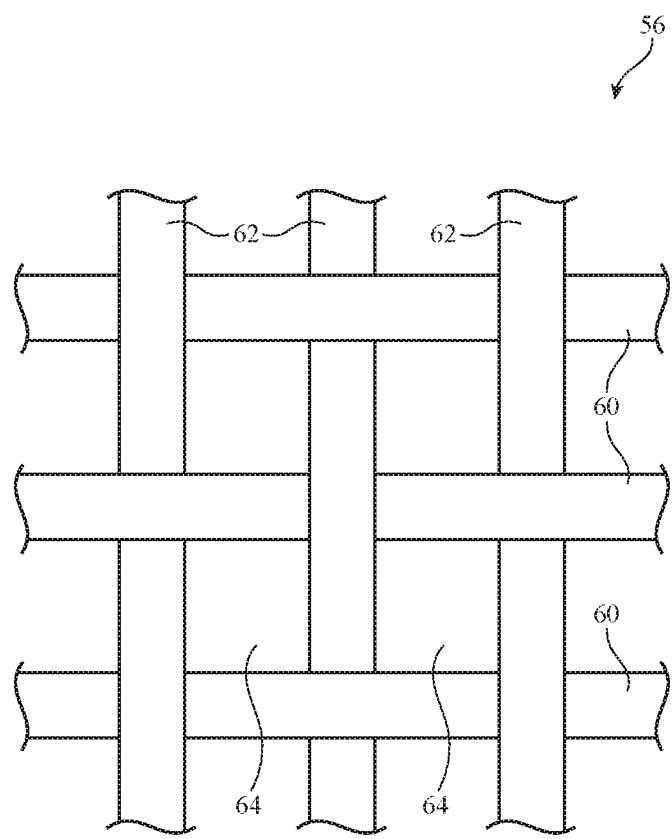
FIG. 10 is a top view of an illustrative fabric layer in accordance with an embodiment.

A top view of fabric 56 of FIG. 9 is shown in FIG. 10. As shown in FIG. 2, openings 64 may be formed by gaps between warp strands 60 and weft strands 62. Openings 64 may overlap airflow ports and may allow air to flow for cooling device 10. The size of openings 64 can be adjusted by adjusting the thickness of strands 60 and 62 (e.g., to enlarge openings 64 by selecting smaller diameter strands or to reduce openings 64 by selecting larger diameter strands), by adjusting the density of strands in fabric 56 (e.g., by adjusting weaving and/or other intertwining techniques to produce a fabric with more or fewer strands per unit area), and/or by locally and/or globally adjusting the thickness (e.g., the number of layers) in fabric 56.

Figure 11:
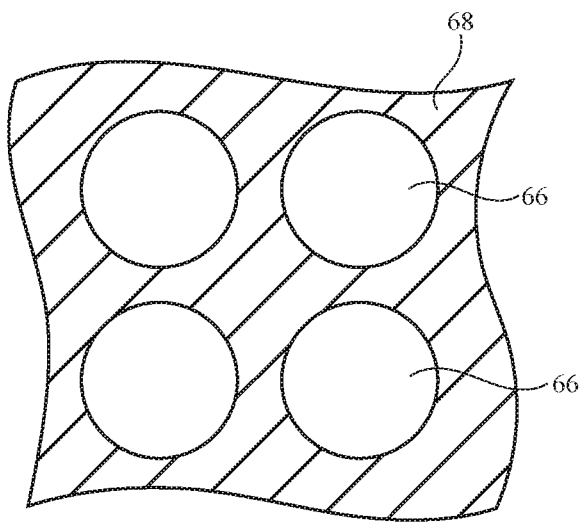
FIG. 11 is a top view of an illustrative housing layer with an array of openings in accordance with an embodiment.
Figure 12:
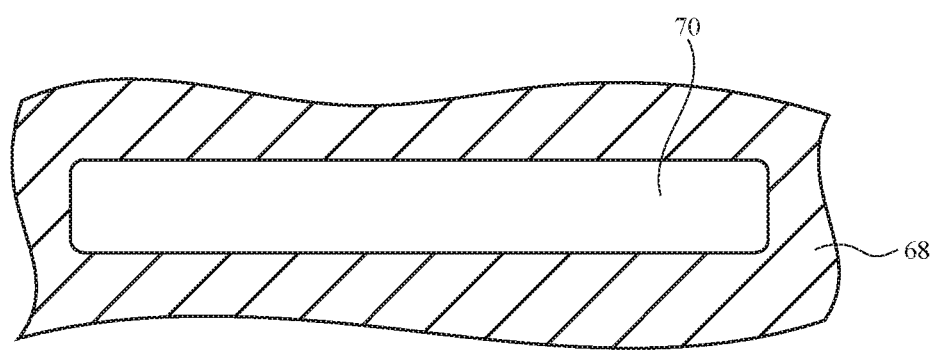
FIG. 12 is a top view of an illustrative housing layer have a slot-shaped opening in accordance with an embodiment.

Openings may also be formed in other layers of material of housing 12. As shown in FIG. 11, for example, circular openings 66 may be formed in housing layer 68 (e.g., a polymer layer, a metal layer, a fabric layer, etc.). FIG. 12 shows how slot-shaped openings 70 may be formed in housing layer 68. If desired, openings may be rectangular, diamond shape, hexagonal, etc. Housing layer 68 may be the only layer of material used in forming walls for housing 12 or may overlap one or more inner layers and/or one or more outer layers of material that form walls for housing 12. As an example, a housing layer such as layer 68 of FIG. 11 may serve as an interior housing structure that is overlapped by an outer cosmetic layer such as fabric 56 of FIG. 10. As another example, a housing layer such as layer 68 of FIG. 11 may be used in forming housing 12 or may be an outer cosmetic layer in a wall of housing 12 that covers internal housing structures.

Openings 66 of FIG. 11, openings 70 of FIG. 12, and/or other openings in housing 12 may be formed by laser drilling, machining, waterjet cutting, die-cutting, punching, sawing, cutting with a blade or other cutting tool, and/or other hole formation techniques. Openings in the walls of housing 12 may have lateral dimensions (e.g., diameters when the openings are circular, lengths and widths when the openings are rectangular, etc.) that are at least 10 microns, at least 100 microns, at least 1 mm, at least 10 mm, at least 100 mm, at least 1 m, less than 2 m, less than 200 mm, less than 20 mm, less than 2 mm, less than 200 microns, less than 20 microns, or other suitable size. The thickness of the walls of housing 12 may be at least 1 micron, at least 10 microns, at least 100 microns, at least 1 mm, less than 5 mm, less than 500 microns, less than 200 microns, or other suitable thickness. Configurations in which arrays of openings are formed may result in one or more regions of mesh in the walls of housing 12. This mesh may be used in forming a Faraday cage (e.g., electromagnetic shielding for radio-frequency signals), may be used in forming a heat spreading layer (e.g., a metal mesh heat spreader, etc.), may be porous to allow materials to flow through the mesh, may be used as a support structure (e.g., a structure that helps hold softer material in a desired shape), and/or may be used in forming other structures in the interior and/or exterior of device 10. In some arrangements, mesh structures (e.g., heat exchange metal meshes, metal fins (e.g., heat sink fins), hexagonal flow channels (e.g., metal channels), and/or other metal structures in device 10 may be used as heat dissipating structures (e.g., heat sinks, heat spreading layers, etc.), and/or other structures that control the flow of heat in device 10. During operation, these heat dissipating structures may become hot. A fabric outer layer (see, e.g., FIG. 9) that covers the heat dissipating structures may be used in preventing a user from inadvertently directly touching such hot heat dissipating structures.

Housing wall openings (see, e.g., openings 66 of FIG. 11 and/or opening 70 of FIG. 12) may be formed in arrays (e.g., the array of rows and columns of openings 66 shown in FIG. 11), may be formed in larger groups (e.g., a set of at least 10, at least 100, fewer than 1000, or other suitable number of openings), and/or may be formed in isolation or in smaller groups (e.g., a single opening or a few openings may be used in forming an air entrance port, a single opening or a few openings may be used in forming an air exit port, etc.). Fabric openings such as openings 64 of FIG. 10 may be arranged to overlap openings in other housing wall layers (e.g., layers of polymer or metal or other material with openings 66 and/or 70, etc.). Fabric openings such as openings 64 (e.g., openings formed by separations between adjacent strands) may have any suitable lateral dimensions such as lateral dimensions that are at least 10 microns, at least 100 microns, at least 1 mm, at least 10 mm, at least 100 mm, at least 1 m, less than 2 m, less than 200 mm, less than 20 mm, less than 2 mm, less than 200 microns, less than 20 microns, or other suitable size.

Figure 13:
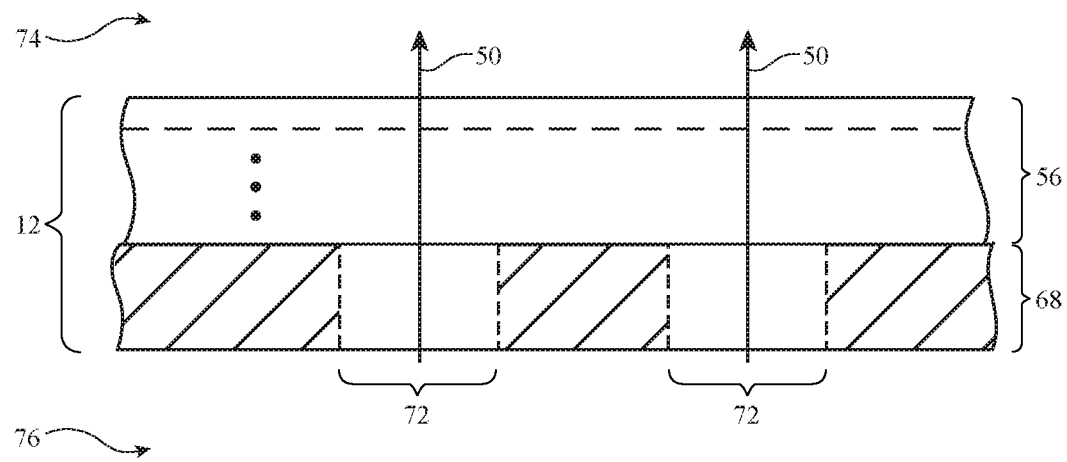
FIG. 13 is a cross-sectional side view of a portion of an illustrative electronic device housing having multiple layers in accordance with an embodiment.

FIG. 13 is a cross-sectional side view of an illustrative housing wall with multiple layers of material. In the example of FIG. 13, housing 12 has outer fabric layer 56 (with one or more sublayers) and inner layer (e.g., a layer of polymer, a layer of metal, one or more layers such as these, etc.). Layer 56 may have openings 64 that overlap openings 72 in layer 68 (e.g., rectangular openings or circular openings such as openings 66 of FIG. 11, elongated openings such as elongated openings 70 of FIG. 12, and/or other openings). As indicated by airflow path 50, air may flow through housing 12 between exterior region 74 and interior region 76 (e.g., cooling air may flow into interior 76 from exterior 74 when opening(s) 72 form part of an entrance port 12FA and heated air may flow out of interior 76 to exterior 74 when opening(s) 72 form part of an exit port 12FB). The area of entrance port 12FA and the area of exit port 12FB may be relatively large (many square cm) without becoming unsightly and may therefore allow the air flow along airflow path 50 to have a relatively low velocity, resulting in quiet operation for device 10.

Figure 14:
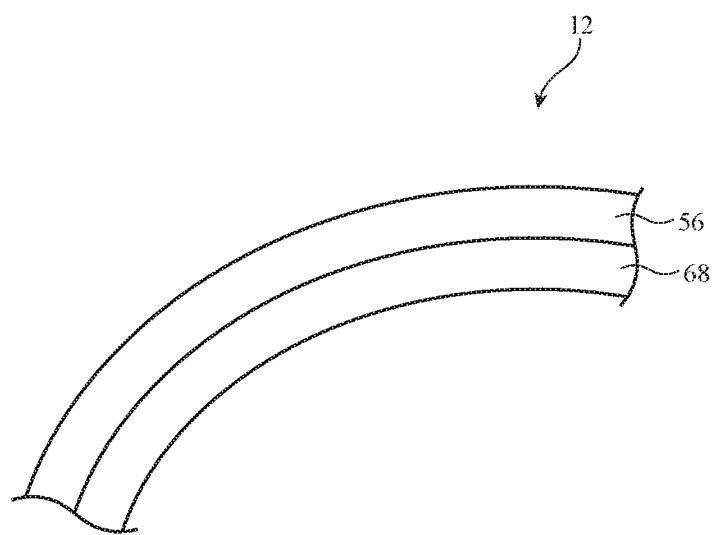
FIG. 14 is a cross-sectional side view of a portion of an illustrative electronic device housing in accordance with an embodiment.

Additional structures may be used in forming housing 12 of FIG. 13 if desired (e.g., one or more additional inner layers, outer layers covering portions of fabric layer 56, etc.). The example of FIG. 13 is illustrative. FIG. 14 shows how housing 12 may have a curved housing wall (e.g., a housing wall with compound curvature, a housing wall with convex and/or concave regions, a housing wall with a combination of planar and non-planar portions, etc.).

Figure 15:
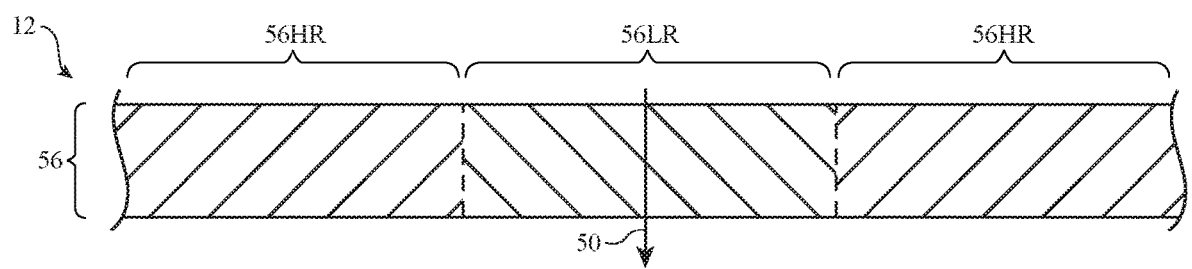
FIG. 15 is a cross-sectional side view of a portion of an illustrative electronic device having areas with different resistances to airflow in accordance with an embodiment.

In addition to or instead of forming ports 12FA and 12FB from openings in housing layer 68, the sizes and/or shapes of fabric openings such as openings 64 that are formed from gaps between adjacent warp strands and between adjacent weft strands and/or other fabric openings may be locally varied. As an example, portions of fabric 56 such as portions 56HR of FIG. 15 may have smaller openings 64 and may therefore have a relatively high resistance to airflow (e.g., portions 56HR may block airflow) and other portions such as portions 56LR may have larger openings 64 and may therefore having a relatively lower resistance to airflow so that air may flow along airflow path 50 through portions 56LR. Fabric layers such as illustrative fabric layer 56 that have different regions with corresponding different resistances to airflow may be formed by varying the diameters of the warp and weft strands in the fabric at different regions across the fabric and/or by varying the size of openings 64 (e.g., by varying the density of strands per area in fabric 56). Openings 64 may also be selectively blocked by filling some or all of these openings in a given area with polymer binder (e.g., a liquid polymer that fills openings 64 and that is cured after filling openings 64).

Figure 16:
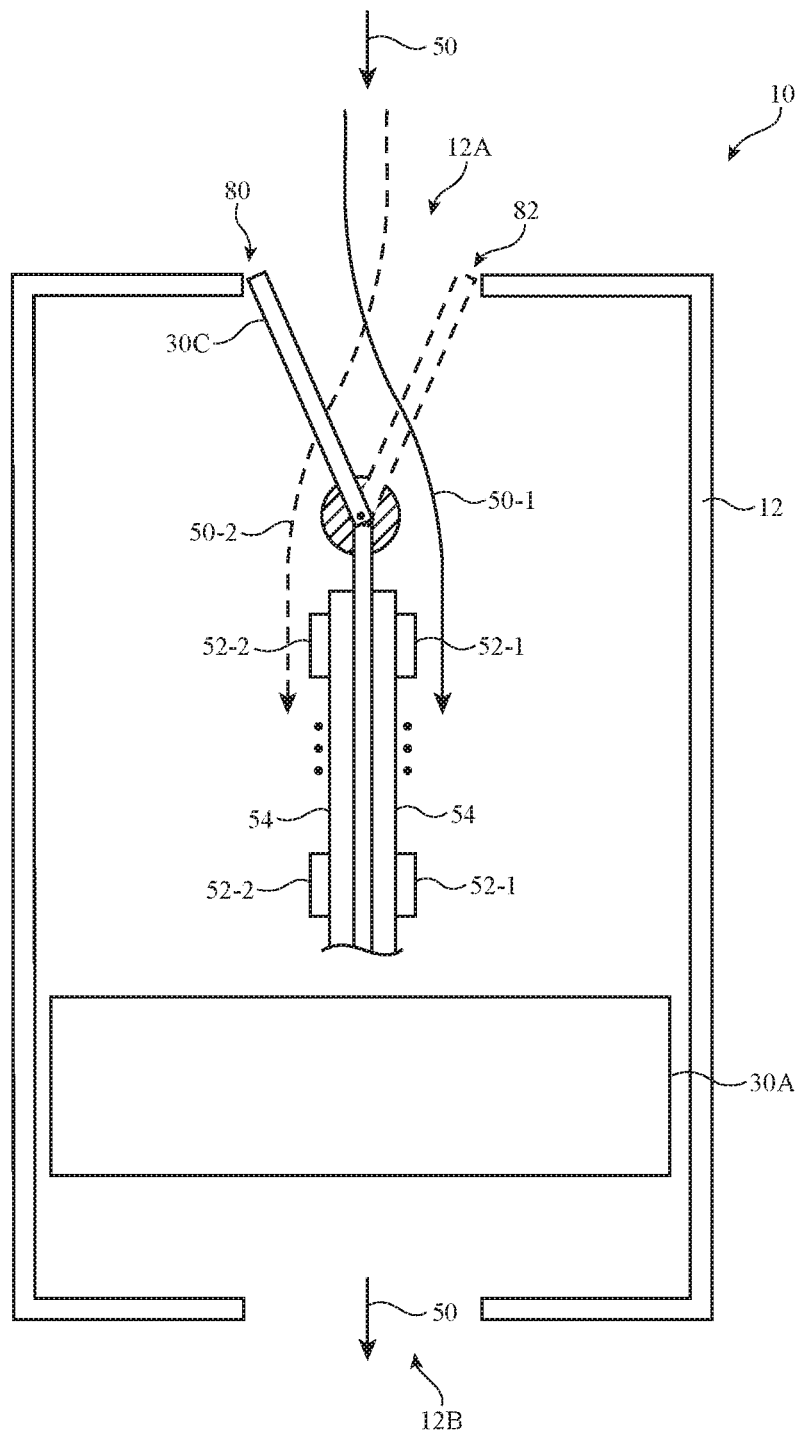
FIG. 16 is a cross-sectional side view of illustrative adjustable airflow controller with an adjustable flap in accordance with an embodiment.

FIG. 16 shows how cooling system 30 may have a dynamically adjustable portion such as adjustable flap 30C and an electrically controllable positioner (e.g., a flap positioner). Flap 30C and the positioner may serve as an airflow controller that steers airflow in device 10. Control circuitry 32 may use the airflow controller to place flap 30C in a first position such as position 80 to route airflow along path 50-1 across components 52-1 before passing through fan(s) 30A or a second position such as position 82 to route airflow along alternative path 50-2 across components 52-2 before passing through fan(s) 30A. Components 52-1 may be, as an example, graphics processing unit integrated circuits that generate large amounts of heat during video playback. The positioner may be an electromagnetic actuator (e.g., a servomotor, a solenoid, etc.) or any other electrically controlled component that adjusts the position of flap 30C. When video is being played back or when the measured temperature of components 52-1 from a temperature sensor exceeds a predetermined threshold and/or is higher than the measured temperature of components 52-2, control circuitry 32 may direct the positioner to place flap 30C in position 80, so that graphics processing unit components 52-1 are provided with enhanced cooling. When video is not being played or when temperature measurements indicate that cooling for components 52-2 is needed, control circuitry 32 may direct the positioner to place flap 30C in position 82 to cool components 52-2.

Figure 17:
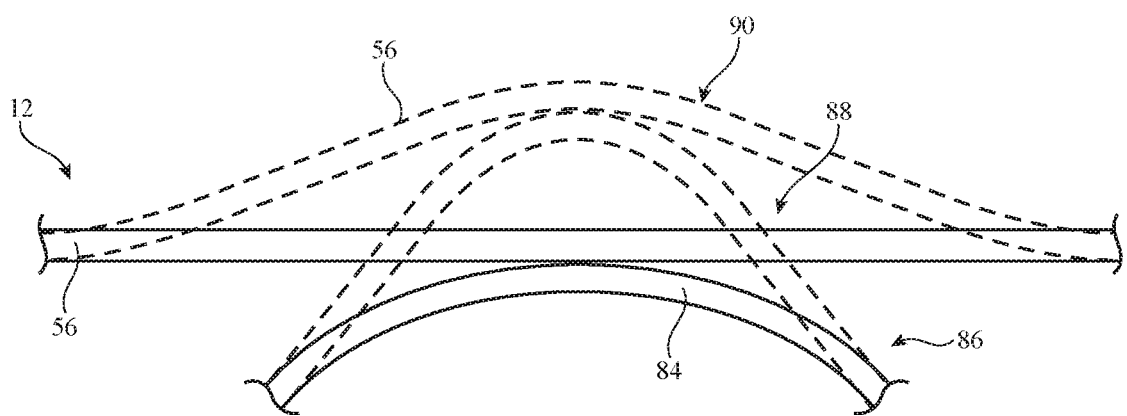
FIG. 17 is a cross-sectional side view of an illustrative adjustable airflow controller in which a layer such as a fabric layer is selectively stretched in accordance with an embodiment.

In the example of FIG. 17, control circuitry 32 issues control signals (e.g., ohmic heating currents) to shape memory wire 84 in shape memory wire actuator 86. When the applied current is low, wire 84 is cool (e.g., at room temperature) and fabric 56 of housing 12 is in its normal planar state, as shown by planar fabric position 88. In this planar state, openings 64 in fabric 56 may have a first size (e.g., openings 64 may be smaller). When control circuitry 32 desires to enhance cooling by lowering the resistance of a portion of housing 12 to airflow, control circuitry 32 may apply a high current to wire 84. This causes wire 84 to deform and thereby stretch fabric 56 into a deformed non-planar state, as shown by bulged fabric position 90. In the stretched state, openings 64 in fabric 56 may have a second size (e.g., openings 64 may be larger). Configurations in which openings 64 shrink in size upon stretching fabric 56 along a given dimension may also be used. The use of shape memory wire actuator 86 as an electrically controllable airflow controller may therefore allow control circuitry 32 to adjust airflow through a portion of fabric layer 56 in housing 12.

Figure 18:
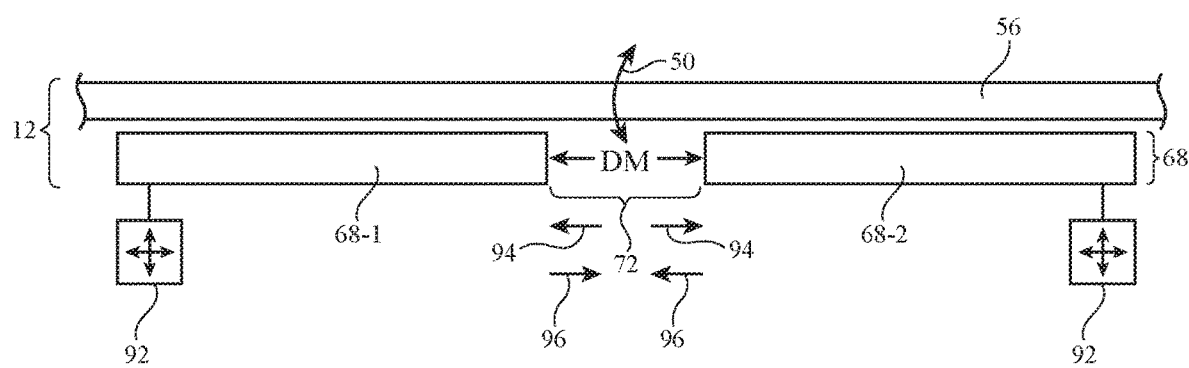
FIG. 18 is a cross-sectional side view of an illustrative adjustable airflow controller with an adjustable housing opening in accordance with an embodiment.

FIG. 18 shows how positioners 92 may be used to move portions of inner housing layer 68, thereby adjusting the size of opening 72. Fabric 56 may have a relatively low resistance to airflow 50 (e.g., where fabric 56 overlaps opening 72). Positioners 92 (e.g., electromagnetic actuators) may be used in moving portions 68-1 and 68-2 of layer 68 outwardly in directions 94 to increase dimension DM of opening 72 and thereby expand opening 72 or inwardly in directions 96 to decrease dimension DM and thereby contract opening 72. By increasing or decreasing the size of opening such as opening 72 using an airflow controller formed from positioners 92 and associated portions of housing 68, the resistance of a port in housing 12 (e.g., an air inflow port or exit port) to airflow may be dynamically adjusted (e.g., to dynamically alter airflow path 50 and thereby actively steer air to a hot component, as described in connection with FIG. 16).

Airflow adjustments to steer airflow using airflow controllers in device 10 may be made in addition to or instead of adjusting the amount of air that is flowing by changing the speed of fan(s) 30A. If desired, airflow controller adjustments may be made by control circuitry 32 in response to temperature measurements made with one or more sensors 34 such as one or more temperature sensors. As an example, a first set of integrated circuits or other components 54 may have a first temperature sensor and a second set of integrated circuits or other components 54 may have a second temperature sensor. Control circuitry 32 can dynamically adjust an airflow controller in device 10 based on temperature measurements from the first and/or second temperature sensors. If, as an example, a first temperature measurement from the first temperature sensor is larger than a second temperature measurement from the second temperature sensor, control circuitry 32 can direct an airflow controller in device 10 to increase airflow past the first set of integrated circuits to enhance cooling for the first set of integrated circuits.

The foregoing is merely illustrative and various modifications can be made to the described embodiments. The foregoing embodiments may be implemented individually or in any combination.

What is claimed is:

1. An electronic device having an interior, comprising:
a housing having an outer layer of fabric and having an inner layer of material with an opening, wherein the inner layer of material faces the interior of the electronic device, the outer layer of fabric comprises a first region that has a first number of strands per unit area and a second region that has a second number of strands per unit area that is less than the first number of strands per unit area, and the outer layer of fabric covers the inner layer;
electrical components in the interior that generate heat; and
a fan that creates airflow along an airflow path that passes through the second region of the outer layer of fabric, through the opening, and across the electrical components.

2. The electronic device defined in claim 1 wherein the electronic device has opposing front and rear faces and wherein the electronic device further comprises:
a display on the front face that is coupled to the housing;
a metal ring-shaped housing structure on the rear face that surrounds the outer layer of fabric; and
a stand coupled to the housing.

3. The electronic device defined in claim 1 further comprising:
an airflow controller; and
control circuitry that is configured to adjust the airflow controller to steer the airflow.

4. The electronic device defined in claim 3 wherein the airflow controller includes a positioner and a member that is positioned by the positioner to steer the airflow.

5. The electronic device defined in claim 3 wherein the airflow controller is configured to selectively stretch a portion of the outer layer of fabric in response to signals from the control circuitry to increase the airflow through the outer layer of fabric.

6. The electronic device defined in claim 5 wherein the airflow controller includes a shape memory alloy structure.

7. The electronic device defined in claim 3 wherein the airflow controller includes a positioner configured to adjust the opening in response to signals from the control circuitry.

8. The electronic device defined in claim 3 further comprising a temperature sensor, wherein the control circuitry is configured to adjust the airflow controller based on a temperature measurement from the temperature sensor.

9. The electronic device defined in claim 1 wherein the electronic device has opposing front and rear faces and wherein the electronic device further comprises a display on the front face that is coupled to the housing.

10. The electronic device defined in claim 9 further comprising a stand that is coupled to the housing on the rear face and that is configured to support the housing.

11. The electronic device defined in claim 1 wherein the outer layer of fabric comprises woven fabric.

12. The electronic device defined in claim 1 wherein the inner layer of material has an additional opening covered by the outer layer of fabric, wherein the opening in the inner layer of material is configured to form an airflow entrance port and wherein the additional opening is configured to form an airflow exit port, and wherein the fan is configured to create the airflow into the interior of the electronic device through the airflow entrance port and out of the interior through the airflow exit port.

13. The electronic device defined in claim 1 wherein the housing has first and second portions joined by hinge structures.

14. The electronic device defined in claim 13 wherein the outer layer of fabric is coupled to the first portion and wherein the electronic device further comprises a display coupled to the second portion.

15. The electronic device defined in claim 1 wherein the inner layer of material comprises a layer of material selected from the group consisting of: a polymer layer and a metal layer and wherein the inner layer of material has an array of openings including the opening and wherein the outer layer of fabric covers the array of openings and is configured to form an airflow exit port.

16. A computer having an interior and an exterior and having opposing front and rear faces, the computer comprising:
a housing having a fabric layer and a metal portion that each form portions of the rear face that are exposed to the exterior of the computer;
electrical components in the interior of the computer;
a fan that creates airflow through the fabric layer that cools the electrical components; and
a display on the front face that is coupled to the housing.

17. The computer defined in claim 16 wherein the housing is on the rear face and wherein the computer further comprises a stand that is coupled to the housing and that is configured to support the housing.

18. The computer defined in claim 17 further comprising:
a housing layer in the housing that has a first opening that forms an airflow entrance port for the airflow and that has a second opening that forms an airflow exit port for the airflow.

19. The computer defined in claim 18 wherein the fabric layer overlaps the airflow entrance port and the airflow exit port.

20. The computer defined in claim 16 wherein the fabric layer comprises woven fabric having warp and weft strands separated by gaps for the airflow.

21. An electronic device, comprising:
a layer of fabric having a first region and a second region that each have openings between adjacent warp strands and between adjacent weft strands, wherein the openings in the first region are blocked;
electrical components including a display, an alternating-current-to-direct-current power converter configured to power the display, integrated circuits, and sensors; and
a fan that creates a cooling airflow that passes through the openings and that cools the electrical components.

22. The electronic device defined in claim 21 further comprising a housing structure with an array of openings, wherein the layer of fabric overlaps the array.

23. The electronic device defined in claim 22 wherein the sensors include a temperature sensor and wherein the electronic device further comprises:
control circuitry configured to gather a temperature measurement from the temperature sensor; and
an airflow controller configured to steer the cooling airflow in response to a control signal from the control circuitry that is generated based on the temperature measurement.

24. The electronic device defined in claim 21 further comprising a metal mesh though which the cooling airflow passes, wherein the metal mesh is configured to form electromagnetic shielding for radio-frequency signals.

25. The electronic device defined in claim 21 further comprising a heat-spreading mesh though which the cooling airflow passes.

26. The electronic device defined in claim 21 further comprising a metal support structure mesh configured to support the layer of fabric in a desired shape.

27. The electronic device defined in claim 21, wherein the openings in the first region are blocked with polymer filler.

* * * * *

UNITED STATES PATENT AND TRADEMARK OFFICE
CERTIFICATE OF CORRECTION

PATENT NO. : 10,642,327 B1
APPLICATION NO. : 16/049682
DATED : May 5, 2020
INVENTOR(S) : Mikael M. Silvanto et al.

Page 1 of 1

It is certified that error appears in the above-identified patent and that said Letters Patent is hereby corrected as shown below:

In the Claims

Column 12, Line 31, in Claim 24, "a metal mesh though which" should read -- a metal mesh through which --

Column 12, Line 35, in Claim 25, "a heat-spreading mesh though which" should read -- a heat-spreading mesh through which --

Signed and Sealed this
Sixteenth Day of February, 2021

Drew Hirshfeld
*Performing the Functions and Duties of the*
*Under Secretary of Commerce for Intellectual Property and*
*Director of the United States Patent and Trademark Office*